(12) United States Patent
Kim et al.

(10) Patent No.: US 12,125,753 B2
(45) Date of Patent: Oct. 22, 2024

(54) SEMICONDUCTOR PACKAGE INCLUDING TEST BUMPS

(71) Applicant: Samsung Electronics Co., Ltd., Suwon-si (KR)

(72) Inventors: Taehyeong Kim, Suwon-si (KR); Hyeongmun Kang, Hwaseong-si (KR); Seungduk Baek, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 365 days.

(21) Appl. No.: 17/584,776

(22) Filed: Jan. 26, 2022

(65) Prior Publication Data
US 2022/0148994 A1 May 12, 2022

Related U.S. Application Data

(63) Continuation of application No. 17/010,059, filed on Sep. 2, 2020, now Pat. No. 11,257,725.

(30) Foreign Application Priority Data

Dec. 6, 2019 (KR) .................. 10-2019-0161319

(51) Int. Cl.
*H01L 21/66* (2006.01)
*H01L 23/00* (2006.01)
(Continued)

(52) U.S. Cl.
CPC .............. *H01L 22/34* (2013.01); *H01L 24/14* (2013.01); *H01L 24/16* (2013.01); *H01L 24/17* (2013.01);
(Continued)

(58) Field of Classification Search
CPC ...................................................... H01L 22/34
See application file for complete search history.

(56) References Cited

U.S. PATENT DOCUMENTS

| 5,729,894 A * | 3/1998 | Rostoker .............. H01L 23/544 |
| | | 29/841 |
| 6,858,941 B2 * | 2/2005 | Ference .................. H01L 24/17 |
| | | 257/781 |

(Continued)

FOREIGN PATENT DOCUMENTS

| JP | 3265197 B2 | 3/2002 |
| JP | 4577839 B2 | 11/2010 |

(Continued)

*Primary Examiner* — William A Harriston
(74) *Attorney, Agent, or Firm* — HARNESS, DICKEY & PIERCE, P.L.C.

(57) ABSTRACT

Disclosed is a semiconductor package comprising a first semiconductor chip and at least one second semiconductor chip on the first semiconductor chip. The second semiconductor chip includes first and second test bumps that are adjacent to an edge of the second semiconductor chip and are on a bottom surface of the second semiconductor chip. The first and second test bumps are adjacent to each other. The second semiconductor chip also includes a plurality of data bumps that are adjacent to a center of the second semiconductor chip and are on the bottom surface of the second semiconductor chip. A first interval between the second test bump and one of the data bumps is greater than a second interval between the first test bump and the second test bump. The one of the data bumps is most adjacent to the second test bump.

20 Claims, 15 Drawing Sheets

(51) Int. Cl.
  *H01L 25/065* (2023.01)
  *H01L 25/10* (2006.01)
  *H01L 25/18* (2023.01)

(52) U.S. Cl.
  CPC ........ *H01L 25/0657* (2013.01); *H01L 25/105* (2013.01); *H01L 25/18* (2013.01); *H01L 2224/1412* (2013.01); *H01L 2224/14515* (2013.01); *H01L 2224/16148* (2013.01); *H01L 2224/17132* (2013.01); *H01L 2224/17133* (2013.01); *H01L 2224/17515* (2013.01); *H01L 2225/06513* (2013.01); *H01L 2225/06524* (2013.01); *H01L 2225/06541* (2013.01); *H01L 2225/06596* (2013.01); *H01L 2225/1058* (2013.01); *H01L 2924/1431* (2013.01); *H01L 2924/1436* (2013.01)

(56) References Cited

U.S. PATENT DOCUMENTS

| | | | | |
|---|---|---|---|---|
| 7,123,480 | B1 * | 10/2006 | Andoh | H01L 23/49838 174/16.3 |
| 7,372,169 | B2 * | 5/2008 | Chang | H01L 23/49816 257/E23.07 |
| 7,675,181 | B2 * | 3/2010 | Lee | H01L 24/02 438/109 |
| 7,759,961 | B2 | 7/2010 | Sylvester | |
| 7,880,485 | B2 * | 2/2011 | Nakamura | G01R 27/14 324/705 |
| 8,110,910 | B2 * | 2/2012 | Kim | H01L 24/97 438/109 |
| 8,349,649 | B2 * | 1/2013 | Kurita | H01L 23/3121 438/455 |
| 8,426,246 | B2 * | 4/2013 | Toh | H01L 25/0657 438/109 |
| 8,674,505 | B2 * | 3/2014 | Rhyner | H01L 23/50 257/737 |
| 8,916,875 | B2 | 12/2014 | Lee | |
| 9,048,233 | B2 * | 6/2015 | Wu | H01L 21/486 |
| 9,383,401 | B2 | 7/2016 | Omori et al. | |
| 9,496,189 | B2 * | 11/2016 | Yu | H01L 22/20 |
| 9,530,706 | B2 | 12/2016 | Kang et al. | |
| 9,825,006 | B2 * | 11/2017 | Miki | H01L 21/563 |
| 10,504,835 | B1 * | 12/2019 | Wang | H01L 24/97 |
| 10,510,724 | B2 * | 12/2019 | Yoo | H01L 23/3142 |
| 10,515,932 | B2 * | 12/2019 | Tsuji | H01L 24/97 |
| 10,833,052 | B2 * | 11/2020 | Shih | H01L 25/0655 |
| 11,257,794 | B2 * | 2/2022 | Song | H01L 25/50 |
| 11,424,172 | B2 * | 8/2022 | Ko | H01L 23/481 |
| 2002/0074637 | A1 * | 6/2002 | McFarland | H01L 23/525 257/E23.146 |
| 2004/0212066 | A1 | 10/2004 | Wang | |
| 2005/0156616 | A1 * | 7/2005 | Morishita | G11C 29/1201 324/754.03 |
| 2005/0189639 | A1 * | 9/2005 | Tanie | H01L 25/0657 257/737 |
| 2007/0007639 | A1 * | 1/2007 | Fukazawa | H01L 25/0657 438/109 |
| 2007/0023887 | A1 * | 2/2007 | Matsui | H01L 25/0657 438/109 |
| 2007/0126085 | A1 * | 6/2007 | Kawano | H01L 21/76898 257/E21.705 |
| 2010/0102428 | A1 * | 4/2010 | Lee | H01L 25/0657 257/E25.013 |
| 2010/0258933 | A1 * | 10/2010 | Fujishima | H01L 21/566 257/E23.145 |
| 2011/0089573 | A1 * | 4/2011 | Kurita | H01L 25/50 438/106 |
| 2011/0093235 | A1 * | 4/2011 | Oh | G01R 31/31726 702/120 |
| 2012/0135565 | A1 * | 5/2012 | Yamato | H01L 23/3128 438/126 |
| 2012/0179391 | A1 | 7/2012 | Omori et al. | |
| 2015/0160276 | A1 * | 6/2015 | Moon | G09G 3/006 702/65 |
| 2015/0359098 | A1 * | 12/2015 | Ock | H05K 1/115 29/842 |
| 2016/0329304 | A1 * | 11/2016 | Hatakeyama | H01L 21/565 |
| 2017/0338206 | A1 * | 11/2017 | Seo | H01L 23/53238 |
| 2021/0066251 | A1 * | 3/2021 | Kim | H01L 25/18 |
| 2021/0265315 | A1 * | 8/2021 | Song | H01L 21/4871 |
| 2022/0139881 | A1 * | 5/2022 | Song | H01L 21/4871 257/713 |
| 2022/0157705 | A1 * | 5/2022 | Yin | H01L 21/4846 |
| 2022/0302087 | A1 * | 9/2022 | Choi | H01L 21/6835 |
| 2022/0328445 | A1 * | 10/2022 | Yu | H01L 24/96 |
| 2023/0384367 | A1 * | 11/2023 | Sun | H01L 24/11 |

FOREIGN PATENT DOCUMENTS

| | | |
|---|---|---|
| JP | 4825235 B2 | 11/2011 |
| JP | 5343555 B2 | 11/2013 |
| KR | 2012/0110451 A | 10/2012 |
| KR | 2015/0112112 A | 10/2015 |

* cited by examiner

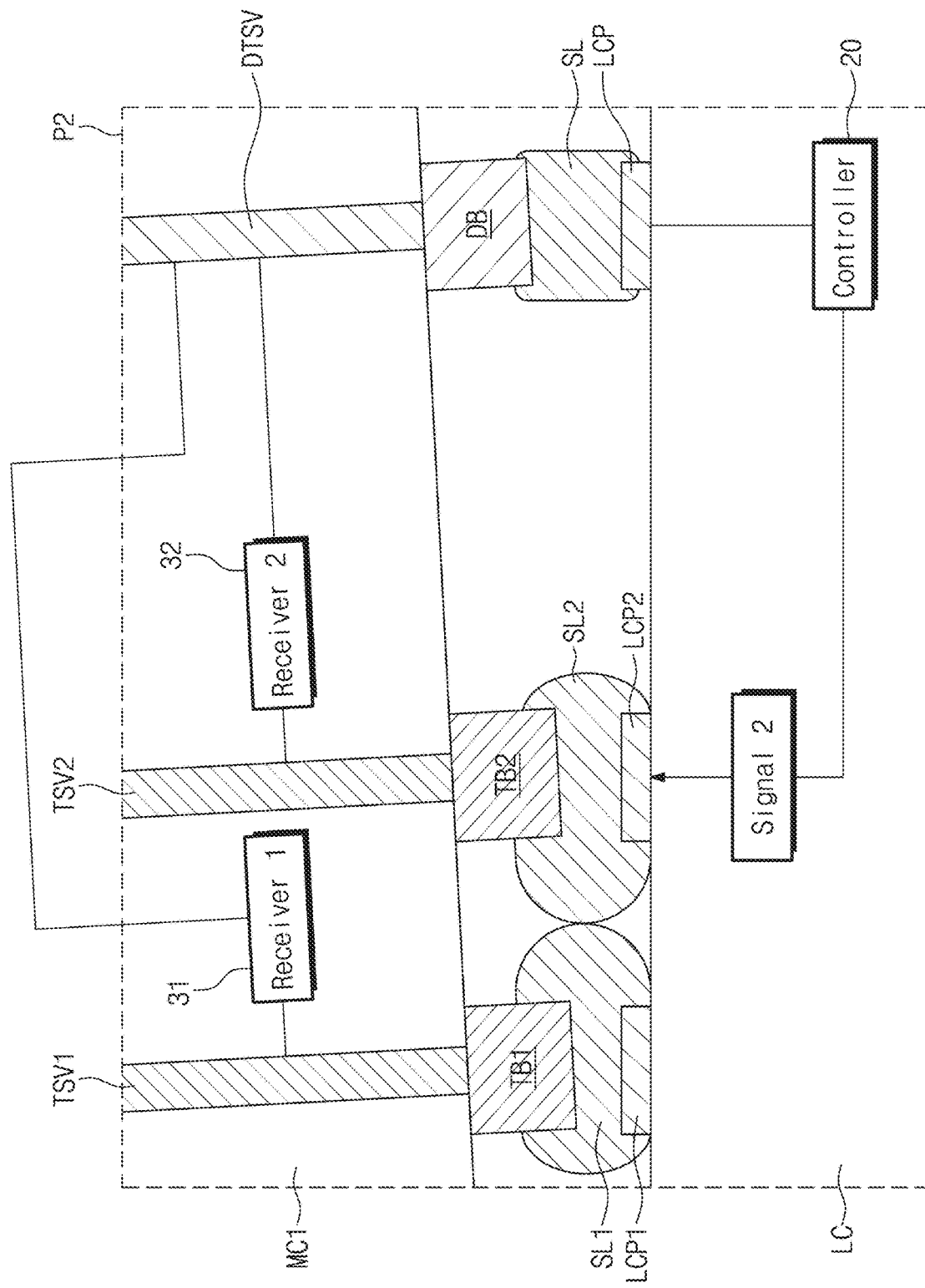

SEMICONDUCTOR PACKAGE INCLUDING TEST BUMPS

CROSS-REFERENCE TO RELATED APPLICATION

This U.S. nonprovisional application is a continuation of U.S. application Ser. No. 17/010,059, filed Sep. 2, 2020, which claims priority under 35 U.S.C § 119 to Korean Patent Application No. 10-2019-0161319, filed on Dec. 6, 2019 in the Korean Intellectual Property Office, the disclosure of each of which is hereby incorporated by reference in its entirety.

BACKGROUND

Inventive concepts relate to a semiconductor package including test bumps.

A semiconductor package is provided to implement an integrated circuit chip to qualify for use in electronic products. A semiconductor package is typically configured such that a semiconductor chip is mounted on a printed circuit board (PCB) and bonding wires or bumps are used to electrically connect the semiconductor chip to the printed circuit board. With the development of electronic industry, many studies have been conducted to improve reliability and durability of semiconductor packages.

SUMMARY

Some example embodiments of inventive concepts provide a semiconductor package with increased reliability.

According to some example embodiments of inventive concepts, a semiconductor package may include a first semiconductor chip; and at least one second semiconductor chip stacked on the first semiconductor chip. The second semiconductor chip may include a first test bump, a second test bump, and a plurality of data bumps on a bottom surface of the second semiconductor chip. The first test bump and the second test bump may be adjacent to each other and an edge of the second semiconductor chip. The plurality of data bumps may be adjacent to a center of the second semiconductor chip with a first interval between the second test bump and one of the plurality of data bumps that is most adjacent to the second test bump. A second interval may be between the first test bump and the second test bump. The first interval may be greater than the second interval.

According to some example embodiments of inventive concepts, a semiconductor package may include a first package substrate and at least one first semiconductor chip stacked on the first package substrate. The first semiconductor chip may include a first test bump, a second test bump, and a plurality of first data bumps on a bottom surface of the first semiconductor chip. The first test bump and the second test bump may be adjacent to each other and an edge of the first semiconductor chip. The plurality of first data bumps may be adjacent to a center of the first semiconductor chip with a first interval between the second test bump and one of the plurality of first data bumps that is most adjacent to the second test bump. The first test bump and the second test bump may have a second interval between each other. The first interval may be greater than the second interval.

According to some example embodiments of inventive concepts, a semiconductor package may include: a logic chip; a plurality of memory chips stacked on the logic chip; and a mold layer covering the logic chip and the plurality of memory chips. Each memory chip among the plurality of memory chips may include a first test bump, a second test bump, and a plurality of data bumps on a bottom surface of the memory chip. The first test bump and the second test bump may be adjacent to each other and an edge the memory chip. The plurality of data bumps being adjacent to of the memory chip with a first interval between the second test bump and one of the plurality of data bumps that is most adjacent to the second test bump. The first test bump and the second test bump may have a second interval between each other. The first interval may be equal to or greater than about twice the second interval.

BRIEF DESCRIPTION OF THE DRAWINGS

FIGS. 4, 5A, and 5B illustrate enlarged views showing section P2 of FIG. 2.

DETAILED DESCRIPTION

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Some example embodiments of inventive concepts will now be described in detail with reference to the accompanying drawings to aid in clearly explaining inventive concepts.

Figure 1:
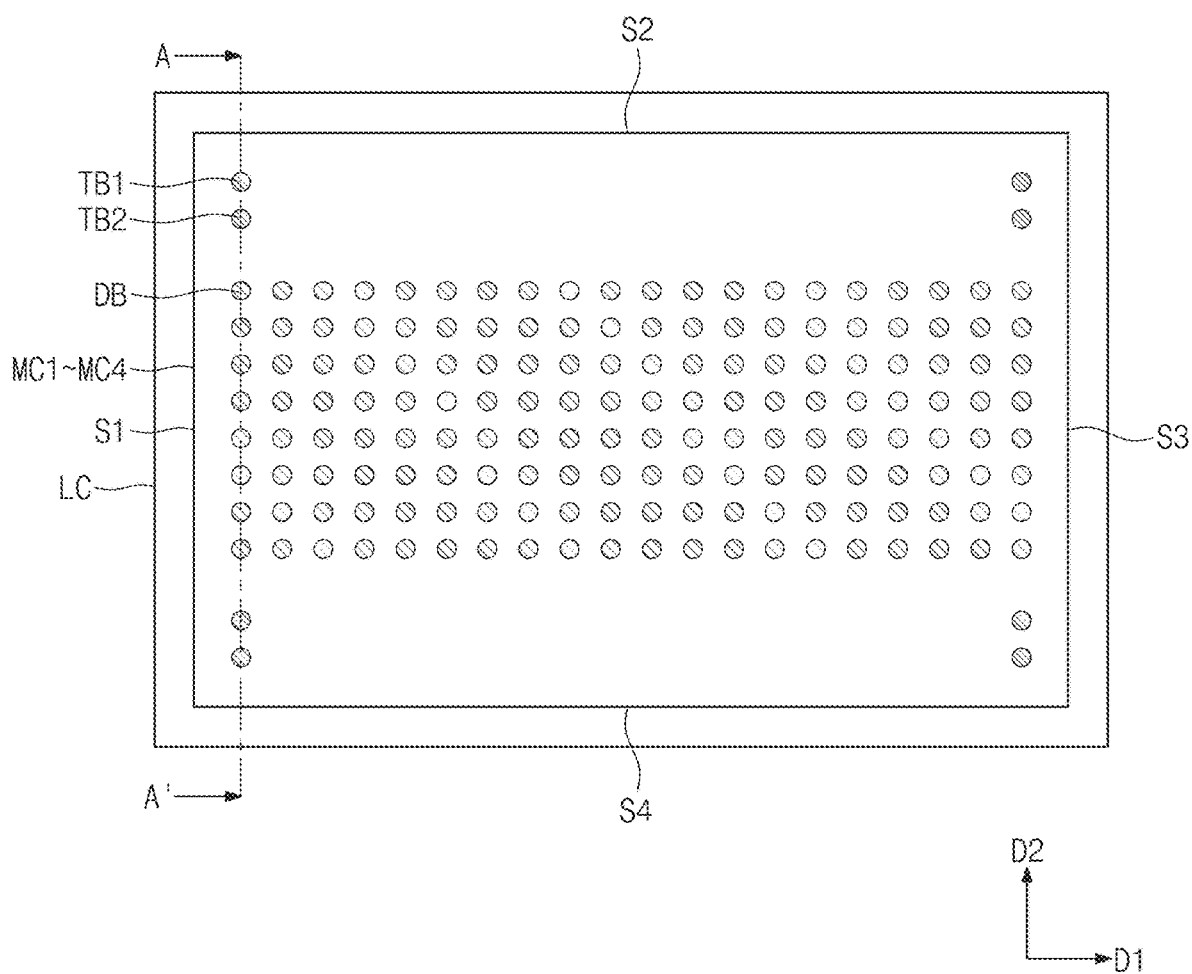
FIG. 1 illustrates a plan view showing a semiconductor package according to some example embodiments of inventive concepts.
Figure 2:
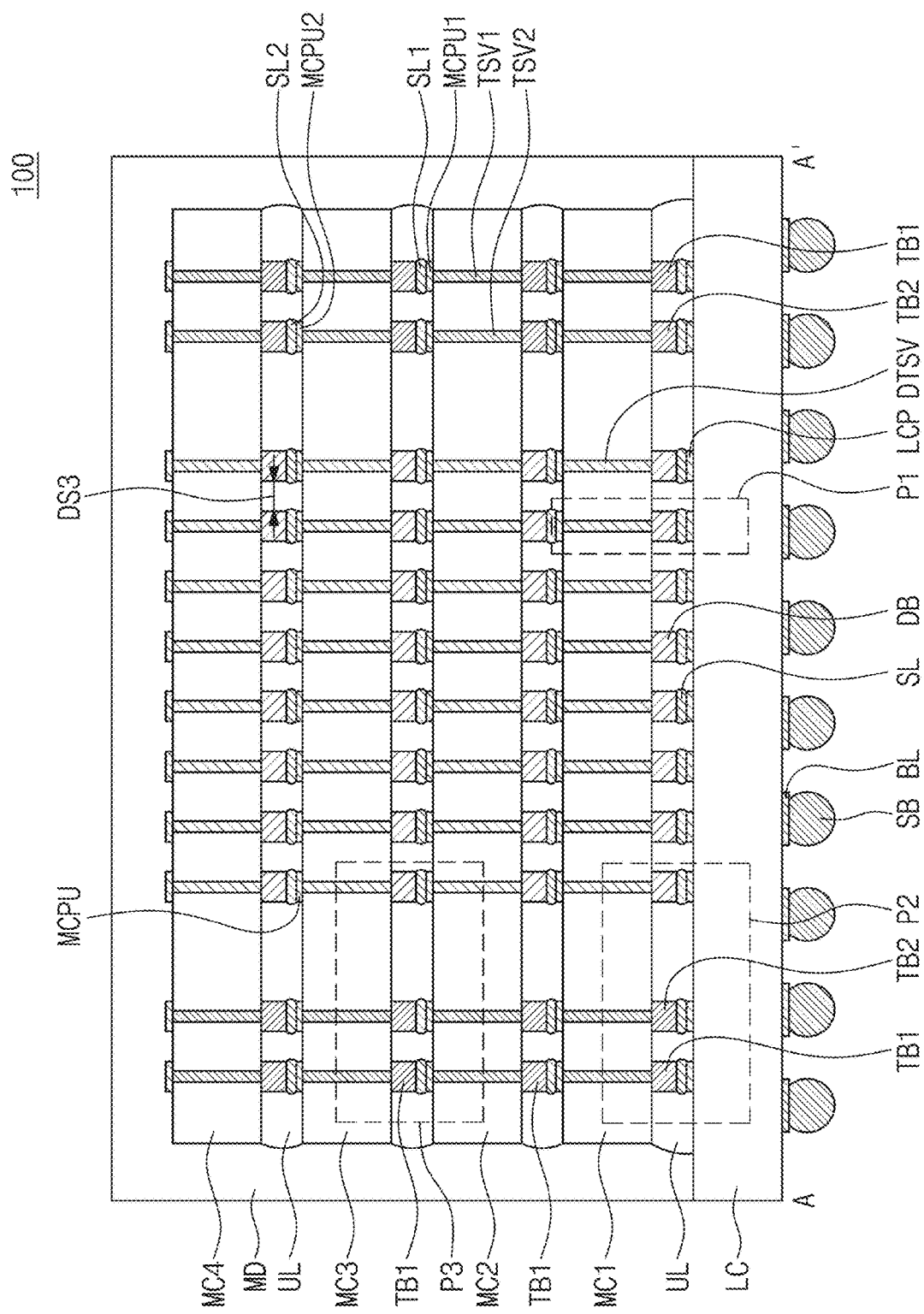
FIG. 2 illustrates a cross-sectional view taken along line A-A' of FIG. 1.
Figure 3:
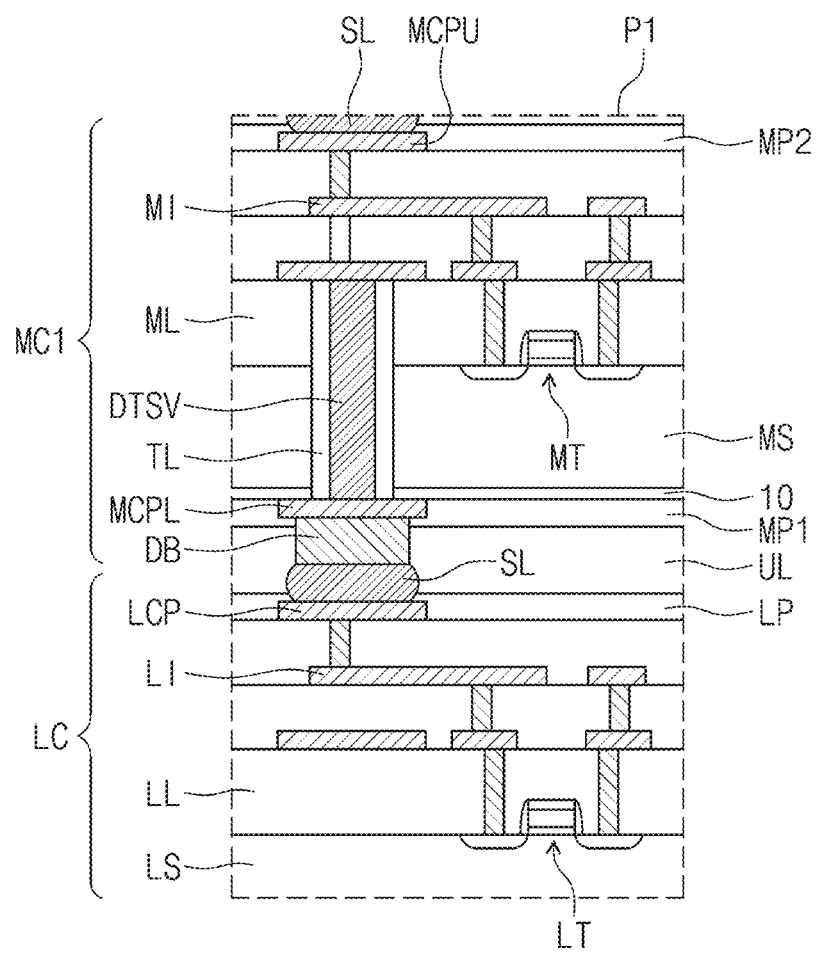
FIG. 3 illustrates an enlarged view showing section P1 of FIG. 2.

FIG. 1 illustrates a plan view showing a semiconductor package according to some example embodiments of inventive concepts. FIG. 2 illustrates a cross-sectional view taken along line A-A' of FIG. 1. FIG. 3 illustrates an enlarged view showing section P1 of FIG. 2.

Referring to FIGS. 1 and 2, a semiconductor package 100 according to some embodiments of inventive concepts may include a logic chip LC and a plurality of memory chips MC1 to MC4 that are stacked on the logic chip LC. The logic chip LC may be called a first semiconductor chip. Alternatively, the logic chip LC may be called a package substrate. Each of the memory chips MC1 to MC4 may be called a second semiconductor chip. The logic chip LC may control the memory chips MC1 to MC4. The memory chips MC1 to MC4 may include, for example, a first memory chip MC1, a second memory chip MC2, a third memory chip MC3, and a fourth memory chip MC4. In the present embodiment, four memory chips MC1 to MC4 are illustrated, but the number of the memory chips MC1 to MC4 is not limited thereto. For example, the memory chips MC1 to MC4 may each be a dynamic random access memory (DRAM) chip. The memory chips MC1 to MC4 may all have the same structure. The logic chip LC may have a width greater than those of the memory chips MC1 to MC4.

Referring to FIGS. 2 and 3, the logic chip LC may include a logic semiconductor substrate LS, a plurality of logic transistors LT disposed on the logic semiconductor substrate LS, a plurality of logic interlayer dielectric layers LL that cover the logic transistors LT, and logic connection lines LI disposed in the logic interlayer dielectric layers LL and electrically connected to the logic transistors LT. The logic semiconductor substrate LS may be, for example, a single-crystalline silicon substrate or a silicon-on-insulator (SDI) substrate. Each of the logic interlayer dielectric layers LL may have one of single-layered and multi-layered structures each of which includes a silicon oxide layer, a silicon nitride layer, a silicon oxynitride layer, or a porous dielectric layer. The logic connection lines LI may include one or more of tungsten, copper, aluminum, titanium, tantalum, and nickel. Logic upper conductive pads LCP may be disposed on an uppermost one of the logic interlayer dielectric layers LL. The logic upper conductive pads LCP may include one or more of tungsten, copper, aluminum, titanium, tantalum, nickel, and tin.

The uppermost one of the logic interlayer dielectric layers LL may be covered with a logic upper passivation layer LP. The logic upper passivation layer LP may include one or more of a silicon nitride layer and a polyimide layer. Ball lands BL may be disposed on a bottom surface of the logic semiconductor substrate LS. The ball lands BL may include one or more of tungsten, copper, aluminum, titanium, tantalum, nickel, and tin.

Although not shown, a dielectric layer may be interposed between the logic semiconductor substrate LS and the ball lands BL. In addition, the logic semiconductor substrate LS may be provided therein with through electrodes (not shown) that electrically connect the logic connection lines LI to the ball lands BL. Furthermore, the ball lands BL and the bottom surface of the logic semiconductor substrate LS may have therebetween redistribution patterns electrically connected to the through electrodes (not shown). Solder balls SB may be bonded to corresponding ball lands BL. The solder balls SB may include one or more of tin and lead.

Referring again to FIGS. 2 and 3, each of the memory chips MC1 to MC4 may include a memory semiconductor substrate MS, a plurality of memory transistors MT disposed on the memory semiconductor substrate MS, a plurality of memory interlayer dielectric layers ML that cover the memory transistors MT, and memory connection lines MI disposed in the memory interlayer dielectric layers ML and electrically connected to the memory transistors MT. The memory semiconductor substrate MS may be, for example, a single-crystalline silicon substrate or a silicon-on-insulator (SOI) substrate. Each of the memory interlayer dielectric layers ML may have one of single-layered and multi-layered structures each of which includes a silicon oxide layer, a silicon nitride layer, a silicon oxynitride layer, or a porous dielectric layer The memory connection lines MI may include one or more of tungsten, copper, aluminum, titanium, tantalum, and nickel. Memory upper conductive pads MCPU may be disposed on an uppermost one of the memory interlayer dielectric layers ML. The memory upper conductive pads MCPU may include one or more of tungsten, copper, aluminum, titanium, tantalum, and nickel. A first test memory conductive pad MCPU1 may be defined to refer to one of the memory upper conductive pads MCPU that is electrically connected to a first test bump TB1 which will be discussed below. A second test memory conductive pad MCPU2 may be defined to refer to one of the memory upper conductive pads MCPU that is electrically connected to a second test bump TB2 which will be discussed below.

The uppermost one of the memory interlayer dielectric layers ML may be covered with a memory upper passivation layer MP2. A bottom surface of the memory semiconductor substrate MS may be covered with a lower dielectric layer 10. The lower dielectric layer 10 may include a silicon oxide layer or a silicon nitride layer. Memory lower conductive pads MCPL may be disposed on the lower dielectric layer 10. The lower dielectric layer 10 may be covered with a memory lower passivation layer MP1. The memory upper passivation layer MP2 and the memory lower passivation layer MP1 may include one or more of a silicon nitride layer and a polyimide layer.

Conductive bumps DB, TB1, and TB2 may be bonded to corresponding memory lower conductive pads MCPL. The conductive bumps DB, TB1, and TB2 may include data bumps DB, first test bumps TB1, and second test bumps TB2. The conductive bumps DB, TB1, and TB2 may include one or more of gold, silver, copper, aluminum, nickel, tin, and lead.

Each of the memory chips MC1 to MC4 may include through electrodes DTSV, TSV1, and TSV2 that penetrate therethrough. The through electrodes DTSV, TSV1, and TSV2 may penetrate the memory semiconductor substrate MS, at least one memory interlayer dielectric layer ML that covers the memory semiconductor substrate MS, and the lower dielectric layer 10, thereby electrically connecting ones of the memory connection lines MI to the memory lower conductive pads MCPL. The through electrodes DTSV, TSV1, and TSV2 may each be surrounded by a through dielectric layer TL and thus may be insulated from the memory semiconductor substrate MS. The through dielectric layer TL may include a silicon oxide layer or a silicon nitride layer. The through electrodes DTSV, TSV1, and TSV2 may include data through electrodes DTSV electrically connected to the data bumps DB, first test through electrodes TSV1 electrically connected to the first test bumps TB1, and second test through electrodes TSV2 electrically connected to the second test bumps TB2.

The conductive bumps DB, TB1, and TB2 of the first memory chip MC1, which is a lowermost one of the memory chips MC1 to MC4, may be connected through solder patterns SL to corresponding logic upper conductive pads LCP of the logic chip LC. The solder patterns SL may include one or more of tin and lead. The memory upper conductive pads MCPU may be correspondingly connected to the conductive bumps DB, TB1, and TB2 through the solder patterns SL between the memory chips MC1 to MC4, which may result in an electrical connection between the memory chips MC1 to MC4.

An under-fill layer UL may be interposed between the logic chip LC and the first memory chip MC1 that is a lowermost one of the memory chips MC1 to MC4 and between the memory chips MC1 and MC4. The under-fill layer UL may include a thermo-curable or photo-curable resin. In addition, the under-fill layer UL may further include an organic or inorganic filler. The logic chip LC and the memory chips MC1 to MC4 may be covered with a mold layer MD. The mold layer MD may include a dielectric resin, for example, an epoxy molding compound (EMC). The mold layer MD may further include a filler, which filler may be dispersed in the dielectric resin. The filler may include, for example, silicon oxide ($SiO_2$).

Referring back to FIGS. 1 and 2, each of the memory chips MC1 to MC4 may include first, second, third, and fourth sidewalls S1, S2, S3, and S4 that are disposed in a clockwise direction. One of the first test bumps TB1 and one of the second test bumps TB2 may constitute a pair, which pair may be disposed adjacent to each of corners where the first, second, third, and fourth sidewalls S1, S2, S3, and S4 meet each other. The second test bump TB2 of the pair may be disposed spaced apart from the first test bump TB1 of the pair in a second direction D2. The data bumps DB may be two-dimensionally arranged along the second direction D2 and a first direction D1 that intersects the second direction D2. Ones of the data bumps DB may be disposed adjacent to centers of the first and third sidewalls S1 and S3. The data bumps DB may be provided such that power signals and data signals are input to and output from circuits disposed within each of the memory chips MC1 and MC4. For example, the data bumps DB may be bumps for transferring electrical signals required for the memory chips MC1 to MC4 to operate their own inherent function and/or purpose. The first and second test bumps TB1 and TB2 may be used to test connection relationships and/or stacking states between the memory chips MC1 to MC4. The first and second test bumps TB1 and TB2 may not participate in the operation of the memory chips MC1 to MC4. This will be further discussed in detail below.

Figure 4:
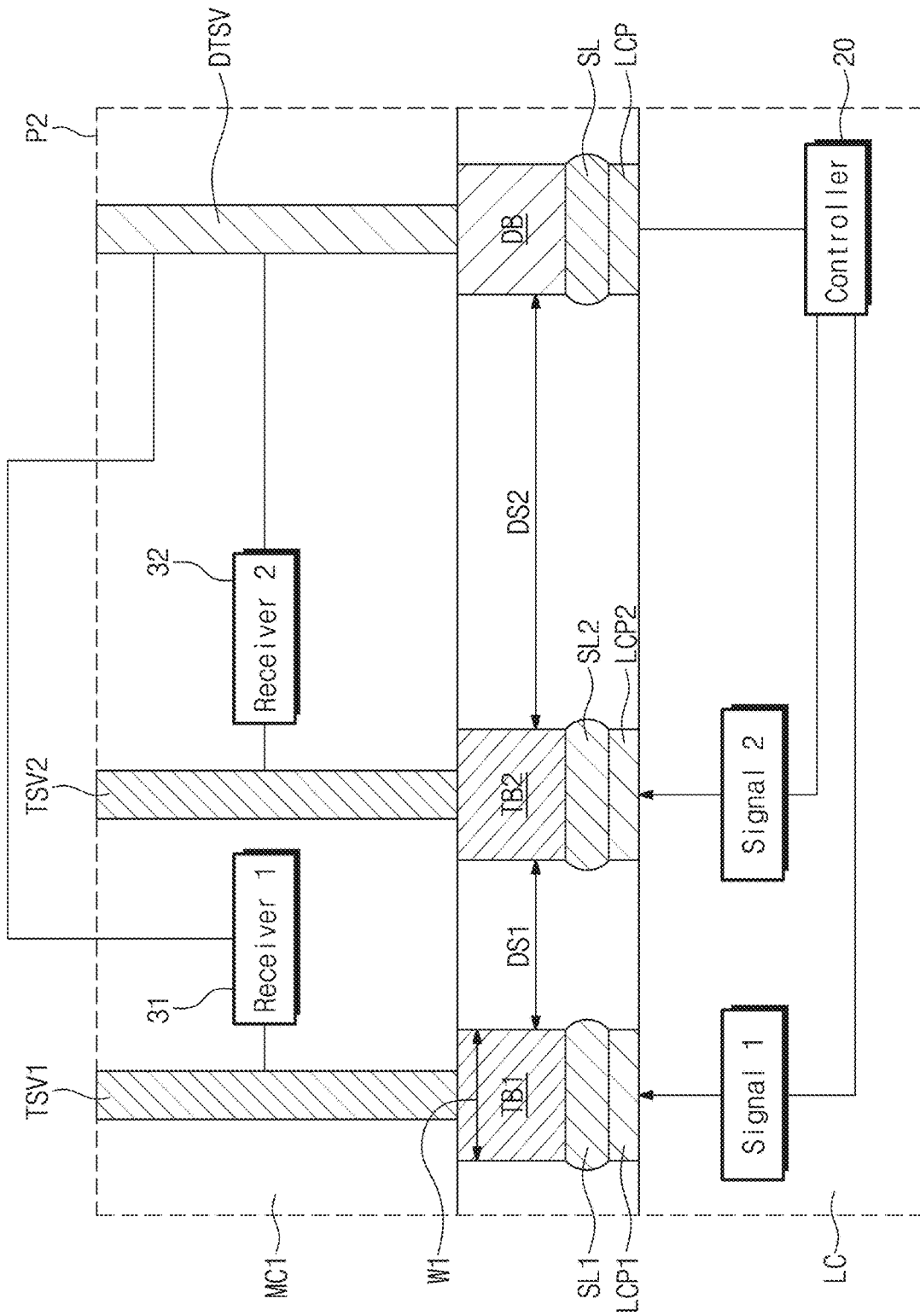
Figure 5A:
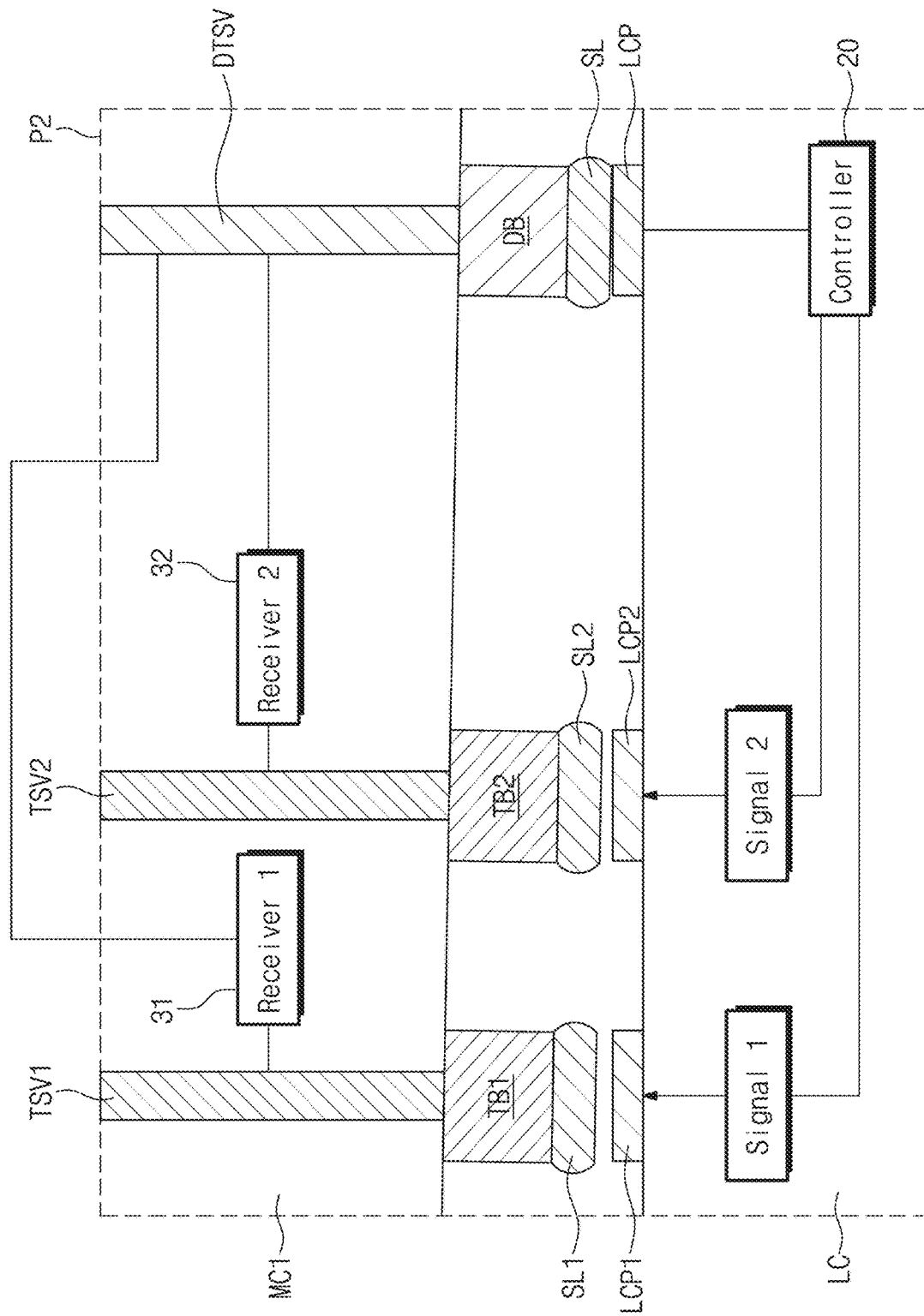

FIGS. 4, 5A, and 5B illustrate enlarged views showing section P2 of FIG. 2.

Referring to FIGS. 2 and 4, the first test bump TB1, the second test bump TB2, and the data bumps DB may all have the same first width W1. The second test bump TB2 may be spaced apart from the first test bump TB1 at a first interval DS1. The first interval DS1 may be the same as or greater than the first width W1. For example, the first width W1 may be about 25 μm. The first interval DS1 may be, for example, about 30 μm. The second test bump TB2 and its closest one of the data bumps DB may be spaced apart from each other at a second interval DS2 greater than the first interval DS1. For example, the second interval DS2 may be equal to or greater than about twice the first interval DS1. Although process failure occurs under the condition with twice or more difference in interval, it may be possible to surely limit and/or prevent short-circuits between the second test bump TB2 and the data bumps DB. The data bumps DB may be spaced apart from each other at a third interval DS3. The third interval DS3 may be the same as the first interval DS1.

A first test logic conductive pad LCP1 may be defined to refer to one of the logic upper conductive pads LCP that is electrically connected to the first test bump TB1. A second test logic conductive pad LCP2 may be defined to refer to one of the logic upper conductive pads LCP that is electrically connected to the second test bump TB2. A first test solder pattern SL1 may be defined to refer to one of the solder patterns SL that is electrically connected to the first test bump TB1. A second test solder pattern SL2 may be defined to refer to one of the solder patterns SL that is electrically connected to the second test bump TB2.

The logic chip LC may include a controller 20 that controls each of the memory chips MC1 to MC4. The controller 20 may be a control circuit that includes the logic connection lines LI and the logic transistors LT illustrated in FIG. 3. The memory chips MC1 to MC4 may each include a first receiver 31 electrically connected to the first test through electrode TSV1. The memory chips MC1 to MC4 may each include a second receiver 32 electrically connected to the second test through electrode TSV2. The first and second receivers 31 and 32 may be portions of circuits that include the memory connection lines MI and the memory transistors MT illustrated in FIG. 3. The first and second receivers 31 and 32 may each be electrically connected to the controller 20 through one of the data through electrodes DTSV and through the data bump DB, the solder pattern SL, and the logic upper conductive pad LCP that are connected to the one of the data through electrodes DTSV. The controller 20 may supply the first test logic conductive pad LCP1 with a first test signal Signal 1. The controller 20 may supply the second test logic conductive pad LCP2 with a second test signal Signal 2.

The controller 20 and receivers 31 and 32 may implemented with processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The controller 20, in conjunction with the receivers 31 and 32, may operate based on control signals (e.g., Signal 1 and Signal 2) generated by the controller 20 and provided to the receivers 31 and 32 and for controlling operations of the memory chips MC1 to MC4 discussed herein, thereby transforming the controller 20 and receivers 31 and 32 into special purpose processing circuitry.

Referring again to FIGS. 2 and 4, when the first test signal Signal 1 is generated from the controller 20 in a state where the first memory chip MC1 is normally stacked on and connected to the logic chip LC, the first receiver 31 may receive the first test signal Signal 1 through the first test logic conductive pad LCP1, the first test solder pattern SL1, the first test bump BP1, and the first test through electrode TSV1. In addition, at this time, the second test signal Signal 2 generated from the controller 20 may be received to the second receiver 32 through the second test logic conductive pad LCP2, the second test solder pattern SL2, the second test bump TB2, and the second test through electrode TSV2. In such cases, the controller 20 may determine that the first memory chip MC1 is normally connected to the logic chip LC.

Referring to FIGS. 2 and 5A, when the logic chip LC is bonded to the first memory chip MC1 that is inclined at a certain angle, an interval between the first test logic conductive pad LCP1 and the first test bump TB1 that is disposed at an edge of the first memory chip MC1 and an interval between the second test bump TB2 and the second test logic conductive pad LCP2 may each be greater than an interval between the data bump DB and the logic upper conductive pad LCP. Therefore, the first test solder pattern SL1 may not be in contact with the first test logic conductive pad LCP1. Moreover, the second test solder pattern SL2 may not be in contact with the second test logic conductive pad LCP2. In such cases, the first receiver 31 may not receive the first test signal Signal 1 generated from the controller 20, and the second receiver 32 may not receive the second test signal Signal 2 generated from the controller 20. Therefore, the controller 20 may decide that open failure occurs at the first test bump TB1 and the second test bump TB2. As a result, the controller 20 may determine (e.g., detect) that the first memory chip MC1 is obliquely bonded.

Referring to FIGS. 2 and 5B, when the logic chip LC is bonded to the first memory chip MC1 that is inclined at a certain angle in a direction opposite to that shown in FIG. 5A, an interval between the first test logic conductive pad LCP1 and the first test bump TB1 that is disposed at an edge of the first memory chip MC1 and an interval between the second test bump TB2 and the second test logic conductive pad LCP2 may each be less than an interval between the data bump DB and the logic upper conductive pad LCP. In such cases, due to compression resulting from the first test bump TB1 and the second test bump TB2, the first test solder pattern SL1 and the second test solder pattern SL2 may be outwardly pushed to contact each other. In order to determine whether the first test solder pattern SL1 and the second test solder pattern SL2 are in contact with each other, the controller 20 may supply the second test logic conductive pad LCP2 with the second test signal Signal 2. When the first receiver 31 receives the second test signal Signal 2, the controller 20 may decide that the first test bump TB1 and the second test bump TB are in contact with each other to produce short failure. As a result, the controller 20 may determine that the first memory chip MC1 is obliquely bonded.

The determination of the controller 20 may be carried out when the semiconductor package 100 is tested after stacking or mounting the memory chips MC1 to MC4 on the logic chip LC or after fabricating the semiconductor package 100. The test procedure for the determination of the connection relationship between the semiconductor chips LC and MC1 to MC4 may be performed on the first, second, third, and fourth memory chips MC1, MC2, MC3, and MC4 in the foregoing sequence.

Figure 6:
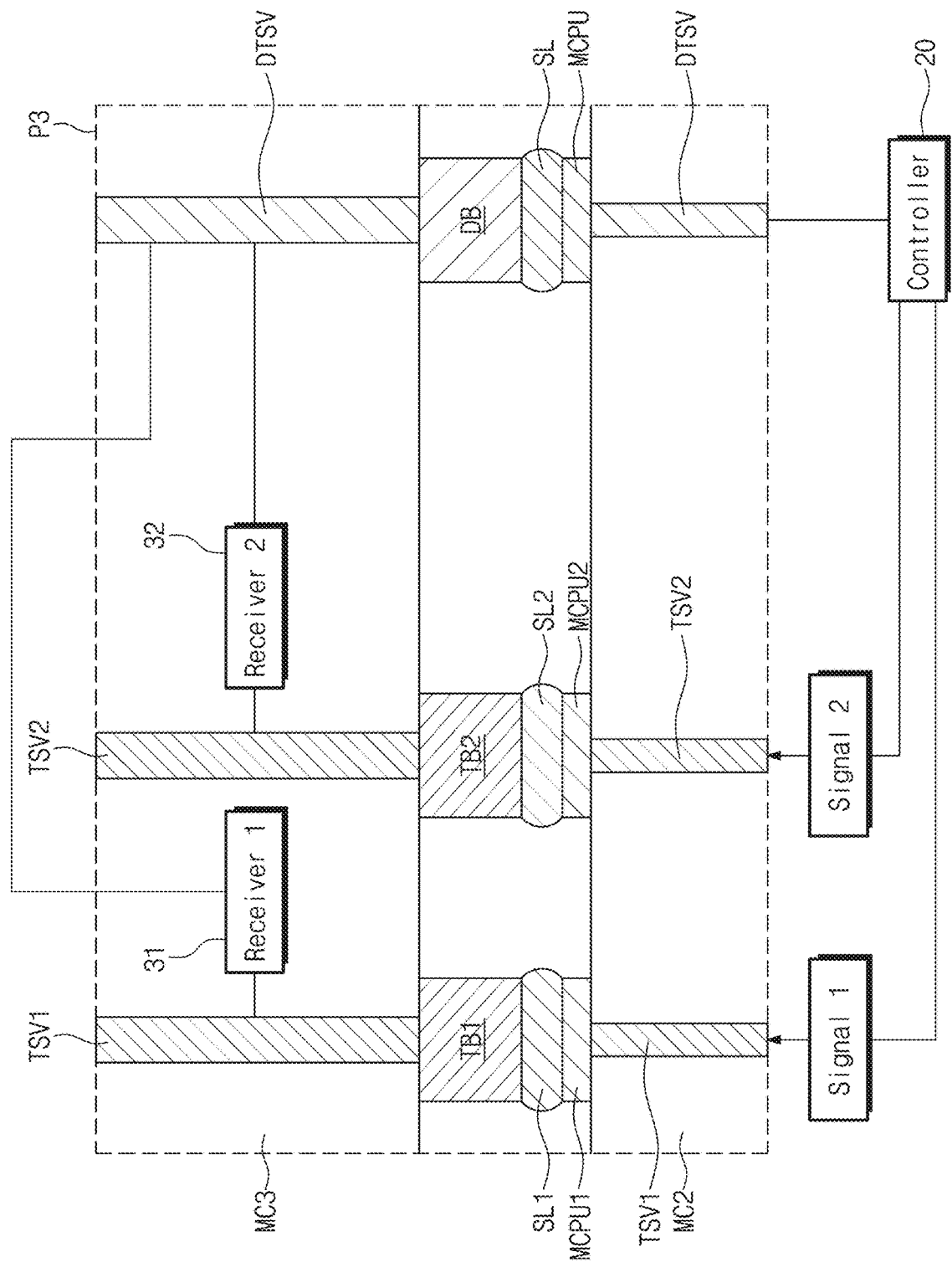
FIG. 6 illustrates an enlarged view showing section P3 of FIG. 2.

FIG. 6 illustrates an enlarged view showing section P3 of FIG. 2.

Referring to FIGS. 2, 4, and 6, in order to determine the connection relationship between the second memory chip MC2 and the third memory chip MC3, the first test signal Signal 1 generated from the logic chip LC may be transferred to the first test memory conductive pad MCPU1 of the second memory chip MC2 through the first test bumps TB1 below the second memory chip MC2 and through the first test through electrodes TSV1 within the first and second memory chips MC1 and MC2. When the first test bump TB1 of the third memory chip MC3 is connected through the first test solder pattern SL1 to the first test memory conductive pad MCPU1 of the second memory chip MC2, the first receiver 31 of the third memory chip MC3 may receive the first test signal Signal 1. In such cases, the controller 20 may determine that the second and third memory chips MC2 and MC3 are normally connected to each other. On the other hand, as discussed above with reference to FIG. 5A, when the first receiver 31 of the third memory chip MC3 cannot receive the first test signal Signal 1, the controller 20 may determine that open failure occurs. In addition, as discussed above with reference to FIG. 5B, when the first receiver 31 of the third memory chip MC3 receives the second test signal Signal 2 generated from the logic chip LC, the controller 20 may determine the occurrence of short failure.

In a test process of semiconductor chips after their stacking and bonding, the semiconductor chips may be determined to be normal when data bumps are normally connected even if one or more of the semiconductor chips are obliquely bonded. In such cases, no failure may be detected in an initial test procedure, but failure may occur during reliability evaluation step or customer's use. In contrast, the semiconductor package 100 according to inventive concepts may include the first test bump TB1 and the second test bump TB2 that are adjacent to each other, and as discussed above, open failure and short failure may be detected to exactly determine whether semiconductor chips are stacked normally or not. As a result, the semiconductor package 100 may increase in reliability.

Because the second interval DS2 is greater than the first interval DS1, the first and second test bumps TB1 and TB2 may be functionally and effectively isolated from the data bumps DB. For example, in the case where the second interval DS2 is the same as the first interval DS1, when short failure occurs at the first test bump TB1 and the second test bump TB2, it may be much more likely that short failure will occur between the second test bump TB2 and its adjacent data bump DB. Therefore, when the second interval DS2 is the same as the first interval DS1, it may be difficult to effectively and selectively detect open failure or short failure occurring at the edge of a memory chip.

Figure 7:
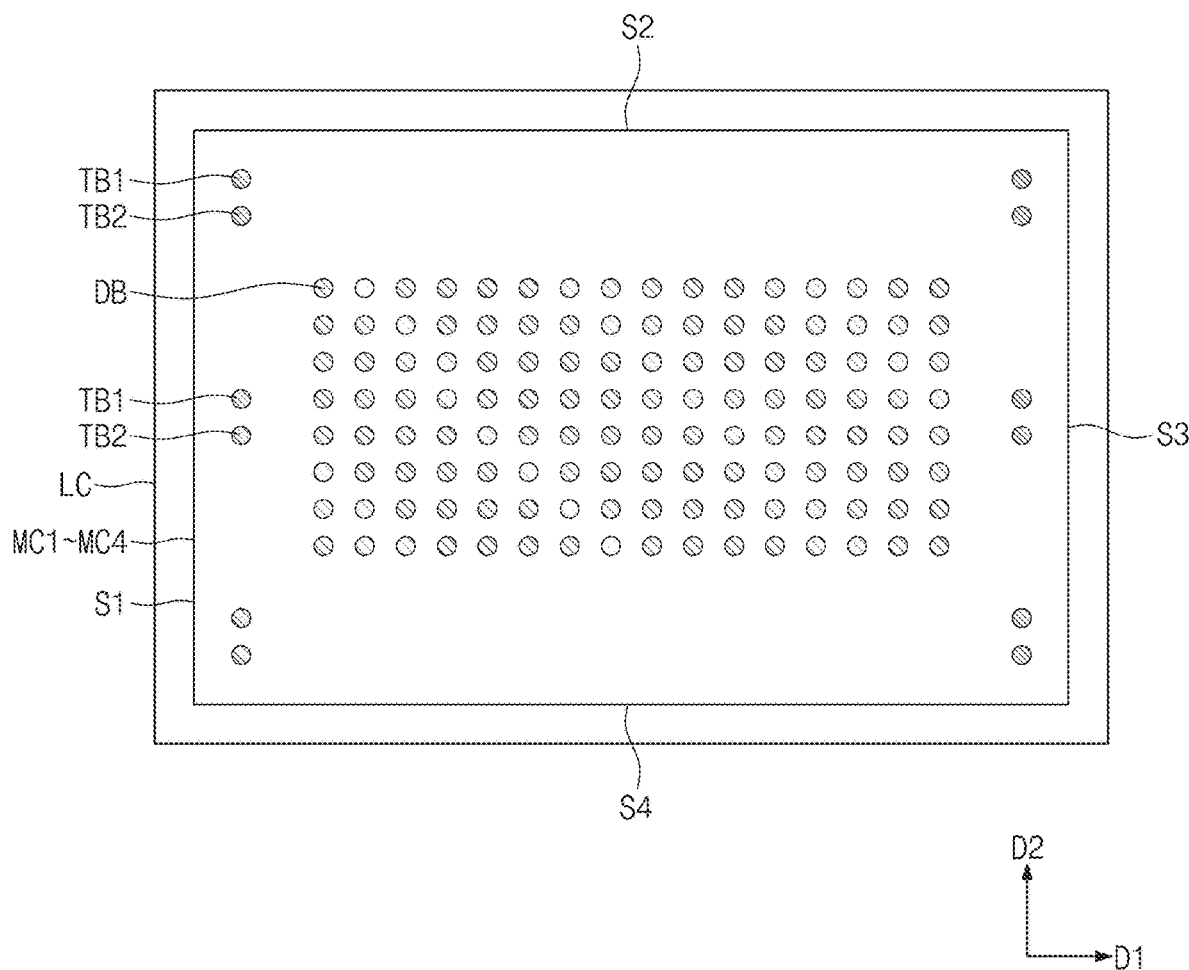
FIGS. 7 to 9 illustrate plan views showing a semiconductor package according to some example embodiments of inventive concepts.
Figure 8:
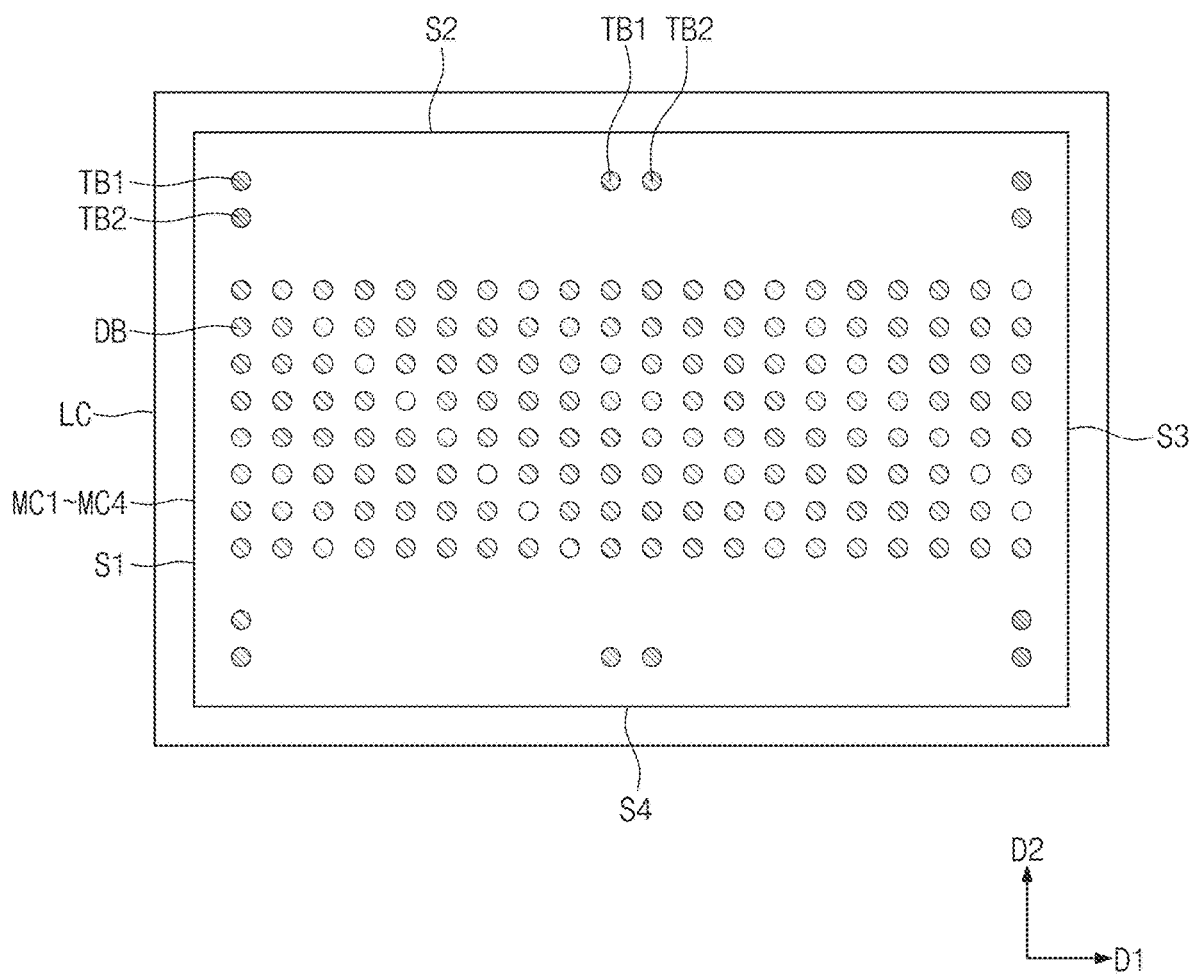
Figure 9:
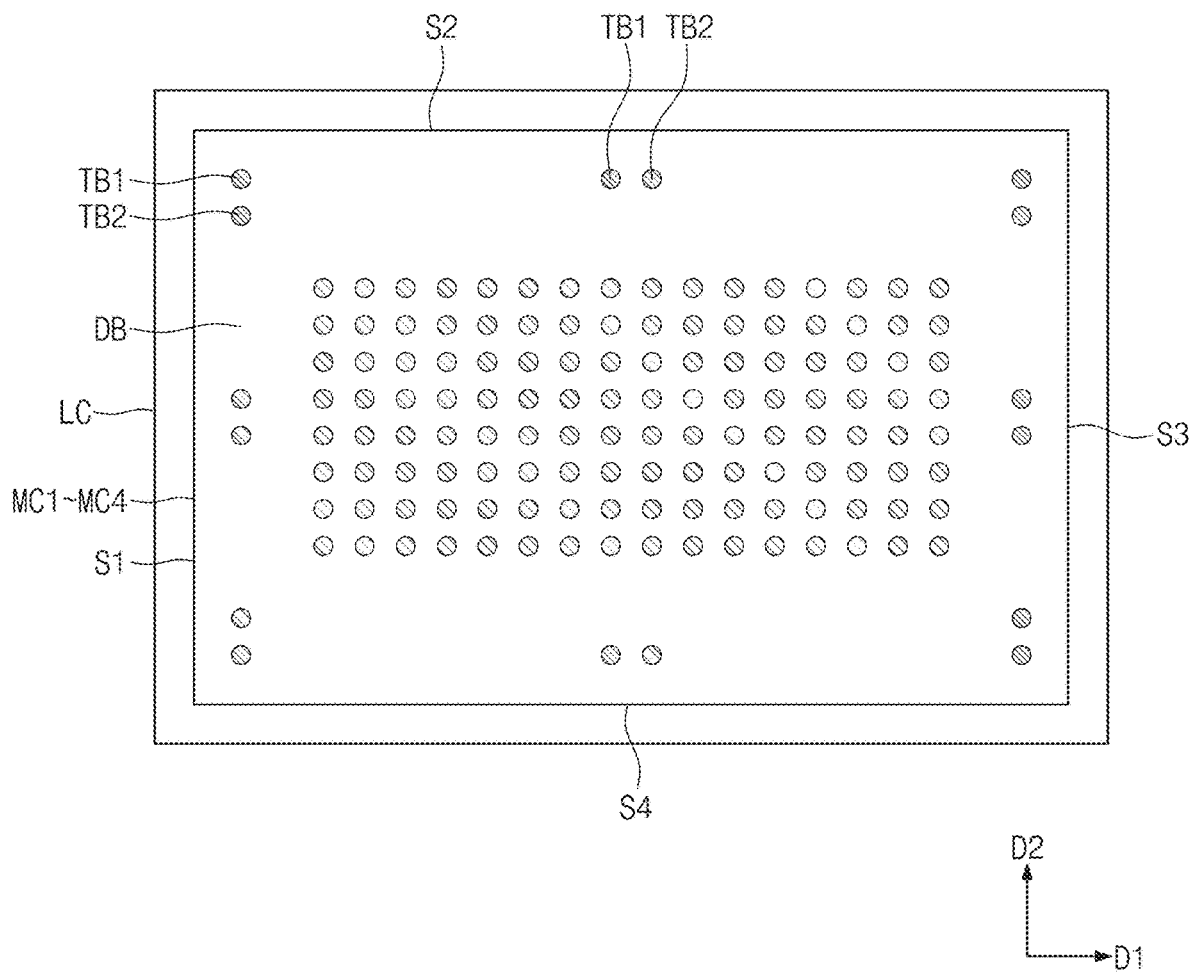

FIGS. 7 to 9 illustrate plan views showing a semiconductor package according to some example embodiments of inventive concepts.

Referring to FIGS. 7 to 9, the memory chips MC1 to MC4 may each include the first, second, third, and fourth sidewalls S1, S2, S3, and S4 that are disposed in a clockwise direction. One of the first test bumps TB1 and one of the second test bumps TB2 may constitute a pair, which pair may be disposed adjacent to each of corners where the first, second, third, and fourth sidewalls S1, S2, S3, and S4 meet each other. For a semiconductor package 100a of FIG. 7, the first and second test bumps TB1 and TB2 that constitute the pair may additionally be disposed adjacent to a center of each of the first and third sidewalls S1 and S3. For a semiconductor package 100b of FIG. 8, the first and second test bumps TB1 and TB2 that constitute the pair may additionally be disposed adjacent to a center of each of the second and fourth sidewalls S1 and S4. For a semiconductor package 100c of FIG. 9, the first and second test bumps TB1 and TB2 that constitute the pair may additionally be disposed adjacent to a center of each of the first, second, third, and fourth sidewalls S1, S2, S3, and S4. Because the first and second test bumps TB1 and TB2 are arranged as discussed above, even when one or more of the memory chips MC1 to MC4 are inclined in any of the first and second directions D1 and D2, it may be possible to effectively detect open failure and short failure and to exactly determine stacking states (e.g., state of inclination, direction of inclination direction, and degree of inclination) of the memory chips MC1 to MC4. Furthermore, according to inventive concepts, because the first test bump TB1 and the second test bump TB2 are present in pair, it may be possible to detect short failure between the first and second test bumps TB1 and TB2. When one of the first and second test bumps TB1 and TB2 is present alone, short failure may be difficult to detect. However, according to inventive concepts, because the first and second test bumps TB1 and TB2 are arranged in pair, semiconductor packages may increase in reliability.

FIGS. 10A to 10E illustrate plan views showing a semiconductor package according some example embodiments of inventive concepts.

Figure 10A:
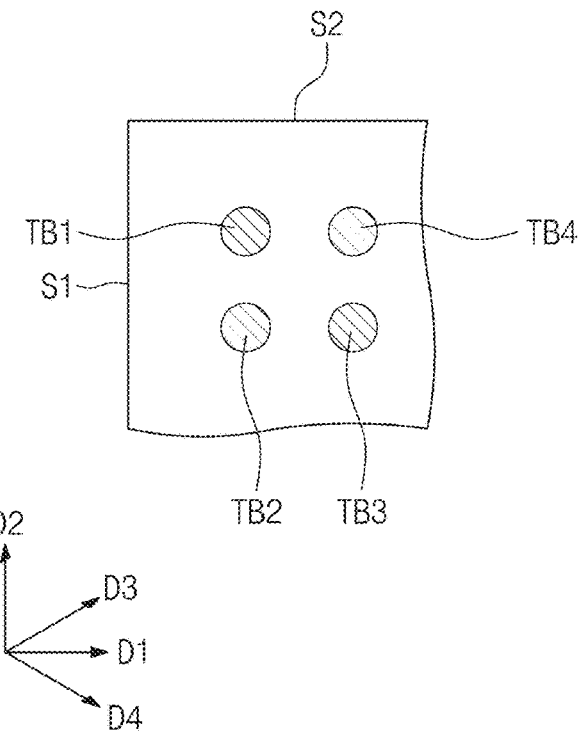
FIGS. 10A to 10E illustrate plan views showing a semiconductor package according some example embodiments of inventive concepts.

Referring to FIG. 10A, first to fourth test bumps TB1 to TB4 may be disposed in a counterclockwise direction adjacent to a corner between the first and second sidewalls S1 and S2 of one of the memory chips (see MC1 to MC4 of FIG. 2). For example, the first test bump TB1 may be spaced apart from the second test bump TB2 in a second direction D2. The fourth test bump TB4 may be spaced apart from the first test bump TB1 in a first direction D1 that intersects the second direction D2. The third test bump TB3 may be spaced apart from the first test bump TB1 in a fourth direction D4 that intersects the first and second directions D1 and D2. The fourth test bump TB4 may be spaced apart from the second test bump TB2 in a third direction D3 that intersects the first, second, and fourth directions D1, D2, and D4. When the first to fourth test bumps TB1 to TB4 are connected to each other, the first to fourth test bumps TB1 to TB4 may constitute a square or rectangular shape.

Figure 10B:
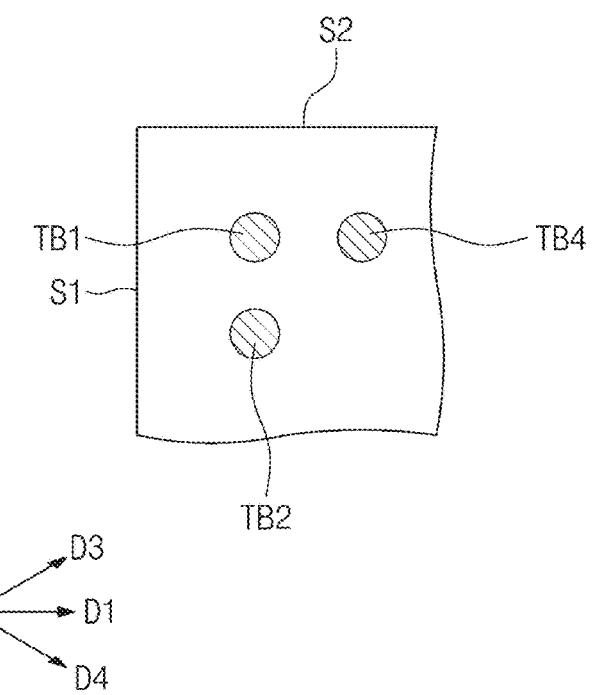

Alternatively, referring to FIG. 10B, the third test bump TB3 may be absent from the arrangement of FIG. 10A. When the first, second, and fourth test bumps TB1, TB2, and TB4 are connected to each other, the first, second, and fourth test bumps TB1, TB2, and TB4 may constitute a regular triangle shape.

Figure 10C:
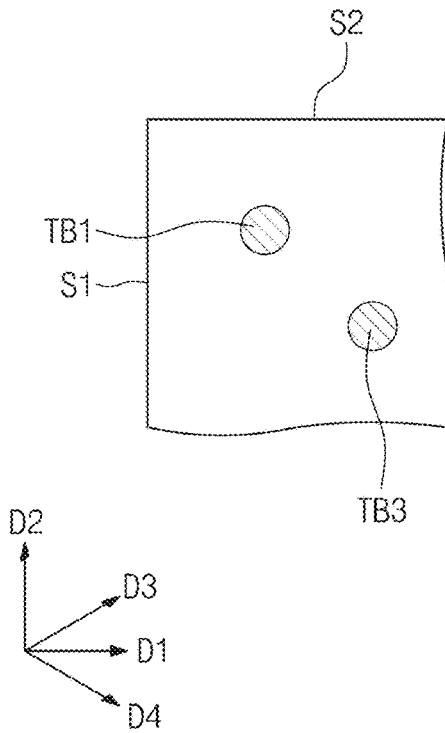

Alternatively, referring to FIG. 10C, the second and fourth test bumps TB2 and TB4 may be absent from the arrangement of FIG. 10A.

Figure 10D:
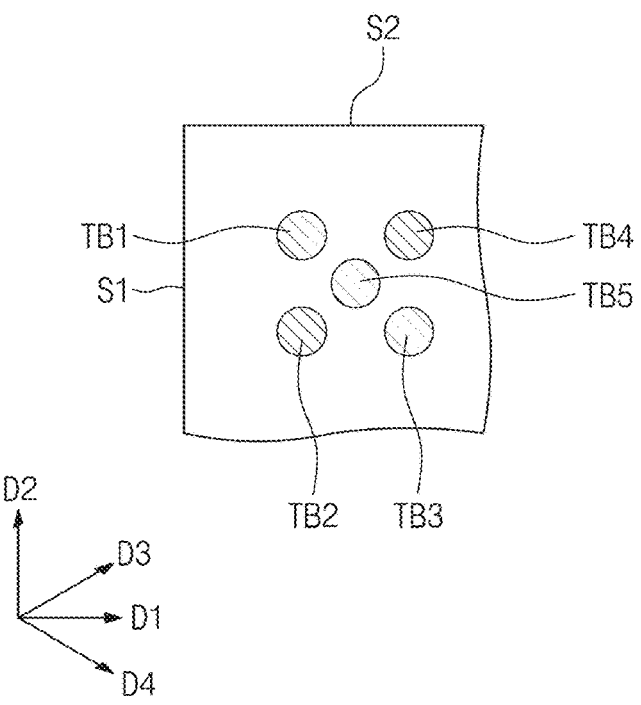

Alternatively, referring to FIG. 10D, a fifth test bump TB5 may be positioned between the second and fourth test bumps TB2 and TB4 shown in FIG. 10A.

Figure 10E:
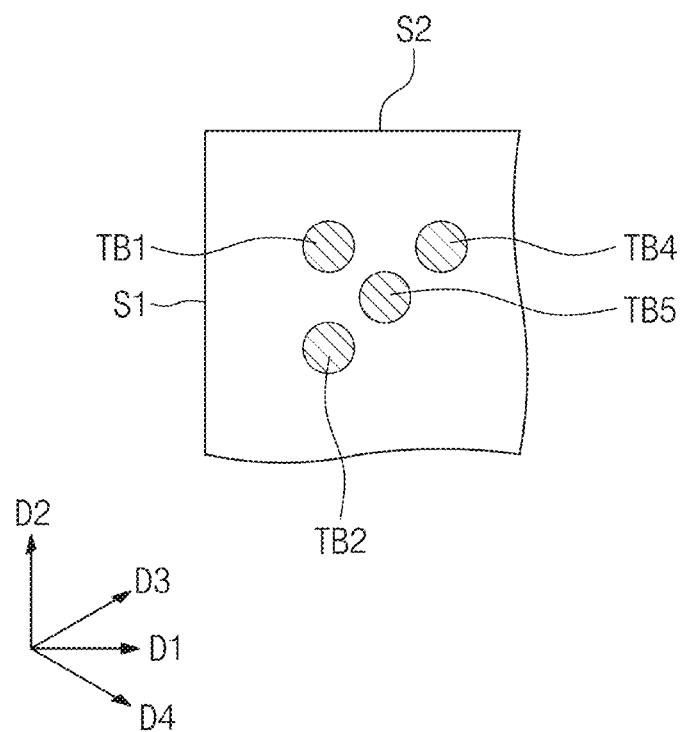

Alternatively, referring to FIG. 10E, the third test bump TB3 may be absent from the arrangement of FIG. 10D.

Because the first to fifth test bumps TB1 to TB5 are arranged as discussed above, even when one or more of the memory chips MC1 to MC4 are inclined in any of the first to fourth directions D1 to D4, it may be possible to effectively detect open failure and short failure and to exactly determine stacking states (e.g., state of inclination, direction of inclination direction, and degree of inclination) of the memory chips MC1 to MC4.

Figure 11:
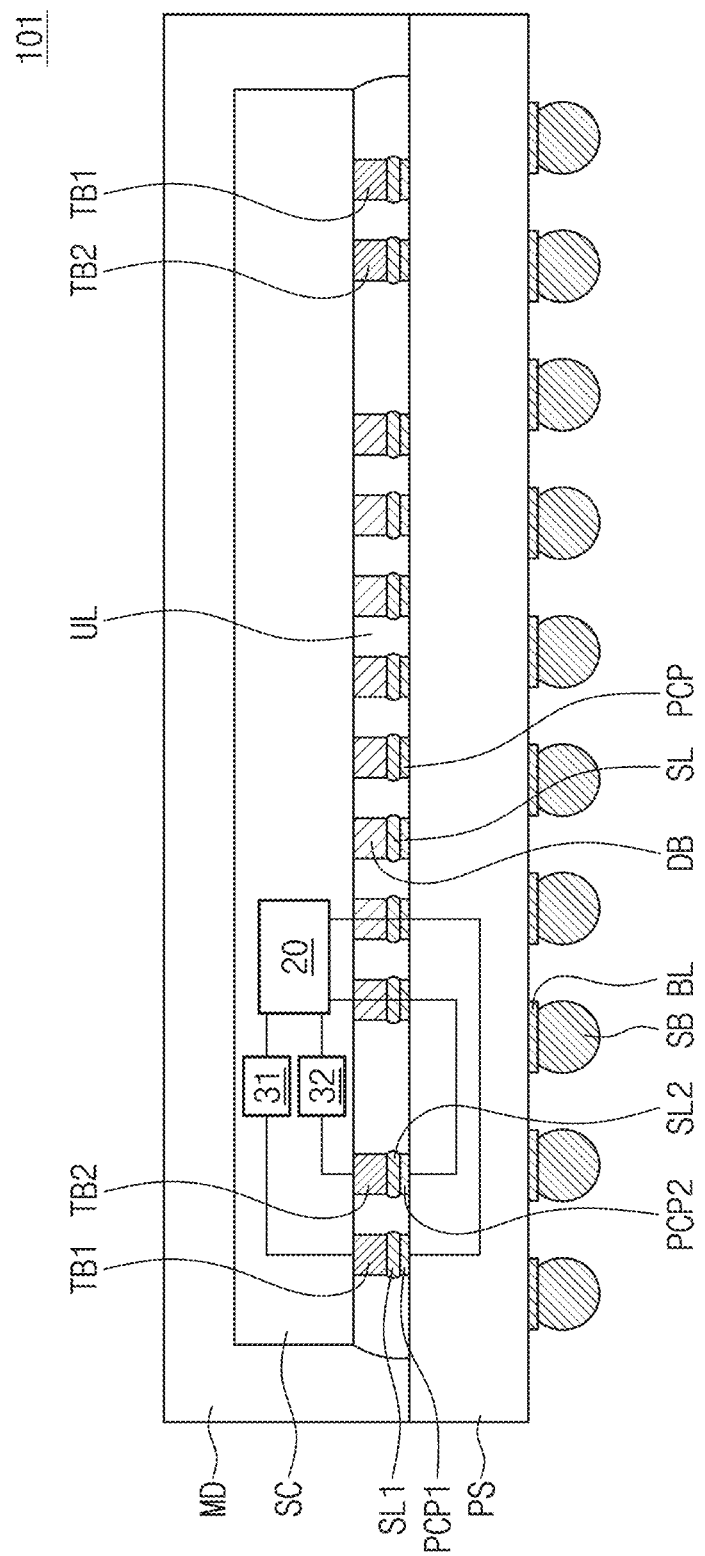
FIG. 11 illustrates a cross-sectional view showing a semiconductor package according to some example embodiments of inventive concepts.

FIG. 11 illustrates a cross-sectional view showing a semiconductor package according to some example embodiments of inventive concepts.

Referring to FIG. 11, a semiconductor package 101 according to the present embodiment may include a semiconductor chip SC mounted on a package substrate PS. The package substrate PS may be a multi-layered printed circuit board. Substrate conductive pads PCP, PCP1, and PCP2 may be disposed on a top surface of the package substrate PS. Ball lands BL may be disposed on a bottom surface of the package substrate PS. The ball lands BL may be electrically connected to the substrate conductive pads PCP, PCP1, and PCP2. Solder balls SB may be bonded to corresponding ball lands BL.

The semiconductor chip SC may include conductive bumps DB, TB1, and TB2 disposed on a bottom surface thereof. The conductive bumps DB, TB1, and TB2 may include data bumps DB disposed adjacent to a center of the semiconductor chip SC, and also include first test bumps TB1 and second test bumps TB2 disposed adjacent to an edge of the semiconductor chip SC.

Solder patterns SL, SL1, and SL2 may be correspondingly interposed between the conductive bumps DB, TB1, and TB2 and the substrate conductive pads PCP, PCP1, and PCP2. The substrate conductive pads PCP, PCP1, and PCP2 may include first test conductive pads PCP1 electrically connected to the first test bumps TB1. The substrate conductive pads PCP, PCP1, and PCP2 may include second test conductive pads PCP2 electrically connected to the second test bumps TB2. The solder patterns SL, SL1, and SL2 may include first test solder patterns SL1 electrically connected to the first test bumps TB1. The solder patterns SL, SL1, and SL2 may include second test solder patterns SL2 electrically connected to the second test bumps TB2.

An under-fill layer UL may be interposed between the semiconductor chip SC and the package substrate PS. The semiconductor chip SC and the package substrate PS may be covered with a mold layer MD.

The semiconductor chip SC may include a controller 20, a first receiver 31, and a second receiver 32. Like the embodiment in FIG. 4, the controller 20, first receiver 31, and second receiver 32 may be implemented with processing circuitry. The first receiver 31 may be electrically connected to the first test bump TB1. The second receiver 32 may be electrically connected to the second test bump TB2. The controller 20 may generate a first test signal, and may supply the first test conductive pad PCP1 with the first test signal through one of the data bumps DB, the solder pattern SL connected to the one of the data bumps DB, the substrate conductive pad PCP connected to the solder pattern SL, and an internal connection line of the package substrate PS.

When the first receiver 31 receives the first test signal, it may be ascertained that the first test bump TB1 is normally connected through the first test solder pattern SL1 to the first test conductive pad PCP1. Likewise, when a second test signal generated from the controller 20 is received to the second receiver 32 through the second test conductive pad PCP2 and the second test bump TB2, it may be ascertained that the second test bump TB2 is normally connected through the second test solder pattern SL2 to the second test conductive pad PCP2. When the first receiver 31 does not receive the first test signal, and when the second receiver 32 does not receive the second test signal, the controller 20 may determine that open failure occurs at the first and second test bumps TB1 and TB2. When the first receiver 31 receives the second test signal that the controller 20 supplies to the second test conductive pad PCP2, the controller 20 may detect short failure between the first and second test bumps TB1 and TB2.

The description with reference to one or more of FIGS. 1, 2, 7 to 9, and 10A to 10E may be identically or similarly applicable to the conductive bumps DB, TB1, and TB2 arranged on a lateral surface and corner of the semiconductor chip SC shown in FIG. 11. Although not shown, the package substrate PS may be provided thereon with a plurality of semiconductor chips SC that are stacked as the memory chips MC1 to MC4 are stacked in FIG. 2.

Figure 12:
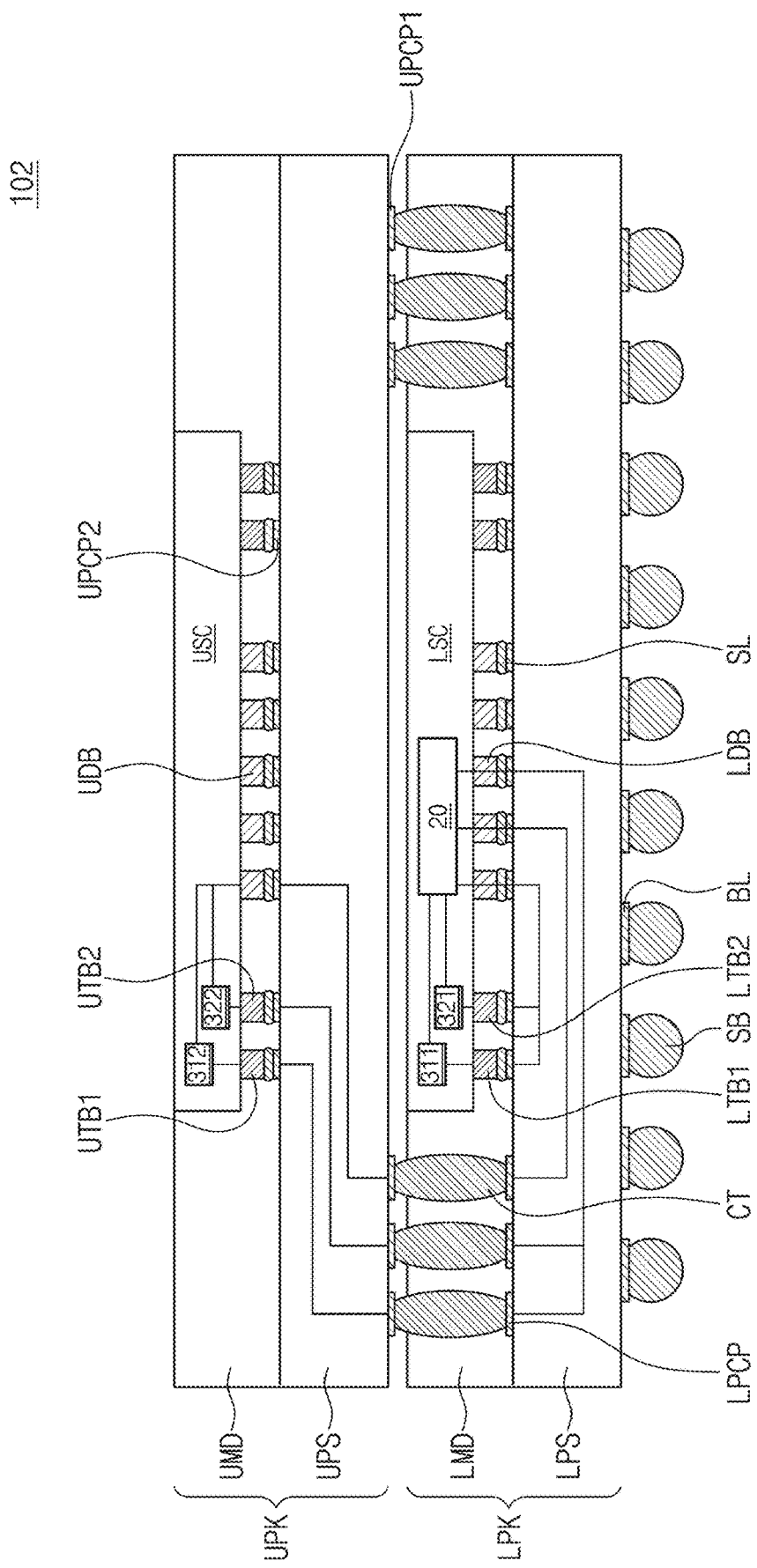
FIG. 12 illustrates a cross-sectional view showing a semiconductor package according to some example embodiments of inventive concepts.

FIG. 12 illustrates a cross-sectional view showing a semiconductor package according to some example embodiments of inventive concepts.

Referring to FIG. 12, a semiconductor package 102 according to the present embodiment may have a package-on-package structure. For example, the semiconductor package 102 may be configured such that an upper semiconductor package UPK is mounted on a lower semiconductor package LPK. FIG. 12 shows a structure in which a semiconductor package is additionally attached to the semiconductor package 101 of FIG. 11. For example, the lower semiconductor package LPK may correspond to the semiconductor package 101 of FIG. 11.

In some embodiments, the lower semiconductor package LPK may include a lower semiconductor chip LSC mounted on a lower package substrate LPS. Lower conductive pads LPCP may be disposed on a top surface of the lower package substrate LPS. Ball lands BL may be disposed on a bottom surface of the lower package substrate LPS. The lower package substrate LPS may be provided therein with internal connection lines that electrically connect the lower conductive pads LPCP to the ball lands BL. Solder balls SB may be bonded to corresponding ball lands BL. The lower package substrate LPS may be a multi-layered printed circuit board. Lower data bumps LDB, a first lower test bump LTB1, and a second lower test bump LTB2 may be bonded to a bottom surface of the lower semiconductor chip LSC.

A lower mold layer LMD may cover the lower package substrate LPS and a lateral surface of the lower semiconductor chip LSC. The lower semiconductor chip LSC may include a controller 20, a first lower receiver 311 connected to the first lower test bump LTB1, and a second lower receiver 321 connected to the second lower test bump LTB2. Like the embodiments in FIGS. 4 and 11, the controller 20 and receivers 311, 312, 321, and 322 may be implemented with processing circuitry.

The description with reference to one or more of FIGS. 1, 2, 7 to 9, and 10A to 10E may be identically or similarly applicable to the lower data bumps LDB, the first lower test bump LTB1, and the second lower test bump LTB2 arranged on a lateral surface and corner of the lower semiconductor chip LSC shown in FIG. 12. Although not shown, the lower package substrate LPS may be provided thereon with a plurality of lower semiconductor chips LSC that are stacked as the memory chips MC1 to MC4 are stacked in FIG. 2.

The upper semiconductor package UPK may include an upper semiconductor chip USC mounted on an upper package substrate UPS. First upper conductive pads UPCP1 may be disposed on a bottom surface of the upper package substrate UPS. Second upper conductive pads UPCP2 may be disposed on a top surface of the upper package substrate UPS. The upper package substrate UPS may be provided therein with internal connection lines that electrically connect the first upper conductive pads UPCP1 to the second upper conductive pads UPCP2. The upper package substrate UPS may be a multi-layered printed circuit board. Upper data bumps UDB, a first upper test bump UTB1, and a second upper test bump UTB2 may be bonded to a bottom surface of the upper semiconductor chip USC.

An upper mold layer UMD may cover the upper package substrate UPS and a lateral surface of the upper semiconductor chip USC. The upper semiconductor chip USC may include a first upper receiver 312 connected to the first upper test bump UTB1 and a second upper receiver 322 connected to the second upper test bump UTB2.

The description with reference to one or more of FIGS. 1, 2, 7 to 9, and 10A to 10E may be identically or similarly applicable to the upper data bumps UDB, the first upper test bump UTB1, and the second upper test bump UTB2 arranged on a lateral surface and corner of the upper semiconductor chip USC shown in FIG. 12. Although not shown, the upper package substrate UPS may be provided thereon with a plurality of upper semiconductor chips USC that are stacked as the memory chips MC1 to MC4 are stacked in FIG. 2.

The upper semiconductor package UPK may be connected through connection terminals CT to the lower semiconductor package LPK. The connection terminals CT may penetrate the lower mold layer LMD, and may connect the first upper conductive pads UPCP1 to the lower conductive pads LPCP. The connection terminals CT may electrically connect the lower package substrate LPS to the upper package substrate UPS. The upper semiconductor chip USC may be electrically connected to the lower semiconductor chip LSC through the upper package substrate UPS, the connection terminals CT, and the lower package substrate LPS. The first upper receiver 312 and the second upper receiver 322 may be electrically connected to the controller 20 through ones of the upper data bumps UDB and ones of the connection terminals CT.

Similarly to that discussed above with reference to FIG. 11, the controller 20 embedded in the lower semiconductor chip LSC may use the first and second lower receivers 311 and 321 to detect whether the first lower test bump LTB1 and the second lower test bump LTB are normally bonded or not. In addition, the controller 20 may use the first and second upper receivers 312 and 322 to detect whether the first upper test bump UTB1 and the second upper test bump UTB2 are normally bonded or not.

According to inventive concepts, a semiconductor package may include a first test bump and a second test bump that are adjacent to each other to detect stacking defects such as open failure or short failure of one or more semiconductor chips and also to detect abnormal stacking states of the semiconductor chips. As a result, semiconductor packages may increase in reliability.

Although inventive concepts have been described in connection with some example embodiments of inventive concepts illustrated in the accompanying drawings, it will be understood to those skilled in the art that various changes and modifications may be made without departing from features and effects of inventive concepts. It will be apparent to those skilled in the art that various substitution, modifications, and changes may be thereto without departing from the scope and spirit of inventive concepts. For example, configurations of semiconductor packages shown in FIGS. 1 to 12 may be combined with each other.

What is claimed is:

1. A semiconductor package comprising:
   a first semiconductor chip;
   at least one second semiconductor chip stacked on the first semiconductor chip;
   a mold layer covering the first semiconductor chip and the second semiconductor chip,
   wherein the first semiconductor chip has a width greater than a width of the second semiconductor chip,
   wherein the second semiconductor chip includes:
      a plurality of outer bumps on a bottom surface of the second semiconductor chip and being adjacent to an edge of the second semiconductor chip;
      a plurality of inner bumps on the bottom surface of the second semiconductor chip and being adjacent to a center of the second semiconductor chip
      a plurality of first through electrodes penetrating the second semiconductor chip and connected with the outer bumps; and
      a plurality of second through electrodes penetrating the second semiconductor chip and connected with the inner bumps,
   wherein a first interval between one of the outer bumps and one of the plurality of inner bumps that is most adjacent to each other being greater than a second interval between the outer bumps, and
   wherein the outer bumps have a width equal to or smaller than the second interval.

2. The semiconductor package as claimed in claim 1, wherein the outer bumps are test bumps, and the inner bumps are data bumps.

3. The semiconductor package of claim 1, wherein
   the inner bumps are spaced apart from each other at a third interval, and
   the third interval is the same as the second interval.

4. The semiconductor package of claim 1, wherein the first interval is equal to or greater than twice the second interval.

5. The semiconductor package of claim 1, wherein
the first semiconductor chip includes a plurality of test conductive pads, and a controller,
each of the test conductive pads are adjacent to the outer bumps respectively,
the controller is configured to control the second semiconductor chip; and
the second semiconductor chip further includes receivers electrically connected to the outer bumps.

6. The semiconductor package of claim 5, wherein
the controller is configured to supply one of the test conductive pads with a first test signal, and
the controller is configured to detect open failure by detecting whether or not the receivers receive the first test signal through the outer bumps.

7. The semiconductor package of claim 5, wherein
the controller is configured to supply one of the test conductive pads with a second test signal, and
the controller is configured to detect short failure based on whether or not the receivers receive the second test signal through the outer bumps.

8. The semiconductor package of claim 1, wherein the plurality of outer bumps each comprise:
a first test bump being adjacent to the edge of the second semiconductor chip; and
a second test bump being adjacent to the inner bumps,
the first test bump and the second test bump each provided in plural to provide a plurality of first test bumps and a plurality of second test bumps,
the second semiconductor chip has a plurality of corners,
at least some of the plurality of first test bumps and at least some of the plurality of second test bumps are paired together to provide pairs adjacent to each of the plurality of corners.

9. The semiconductor package of claim 8, wherein
the second semiconductor chip has first to fourth sidewalls arranged in a clockwise direction, and
other first test bumps among the plurality of first test bumps and other second test bumps among the plurality of second test bumps are paired adjacent to each other and arranged adjacent to a center of at least one of the first to fourth sidewalls.

10. The semiconductor package of claim 1, wherein the plurality of outer bumps each comprise:
a first test bump being adjacent to the edge of the second semiconductor chip;
a second test bump being adjacent to the inner bumps, the second test bump is spaced apart from the first test bump in a first direction; and
at least one third test bump that is spaced apart from the first test bump in a second direction intersecting the first direction.

11. The semiconductor package of claim 1, wherein
the first semiconductor chip is a logic chip, and
the second semiconductor chip is a memory chip.

12. A semiconductor package, comprising:
a package substrate; and
at least one first semiconductor chip stacked on the package substrate,
wherein the first semiconductor chip has first to fourth sidewalls arranged in a clockwise direction, the second and fourth sidewalls have a width greater than a width of the first and third sidewalls,
wherein the first semiconductor chip includes:
a plurality of first outer bumps, a plurality of second outer bumps, a plurality of inner bumps on a bottom surface of the first semiconductor chip; and
a plurality of through electrodes penetrating the first semiconductor chip and connected with the first outer bumps, the second outer bumps, and the inner bumps,
wherein the inner bumps are adjacent to a center of the first semiconductor chip,
wherein at least some of the plurality of first outer bumps and at least some of the plurality of second outer bumps, are paired together to provide pairs adjacent to each of a plurality of corners of the first semiconductor chip,
wherein other first outer bumps among the plurality of first outer bumps and other second outer bumps among the plurality of second outer bumps are adjacent to each other and arranged adjacent to a center of at least one of the first to fourth sidewalls,
wherein a first interval between one of the second outer bumps and one of the inner bumps that is most adjacent to each other is greater than a second interval between the pairs of the first outer bumps and the second outer bumps, and
wherein the first outer bumps have a width equal to or smaller than the second interval.

13. The semiconductor package of claim 12, wherein the other first outer bumps and the other second outer bumps that constitute the pair are disposed adjacent to a center of each of the first and third sidewalls.

14. The semiconductor package of claim 12, wherein the other first outer bumps and the other second outer bumps that constitute the pair are disposed adjacent to a center of each of the second and fourth sidewalls.

15. The semiconductor package of claim 12, wherein the other first outer bumps and the other second outer bumps that constitute the pair are disposed adjacent to a center of each of the first, second, third, and fourth sidewalls.

16. The semiconductor package as claimed in claim 12, wherein the first and second outer bumps are test bumps, and the inner bumps are data bumps.

17. The semiconductor package of claim 12, wherein
the inner bumps are spaced apart from each other at a third interval, and
the third interval is the same as the second interval.

18. The semiconductor package of claim 12, wherein the first interval is equal to or greater than twice the second interval.

19. The semiconductor package of claim 12, wherein
the package substrate includes a first test conductive pad, a second test conductive pad, and a controller,
the first test conductive pad is adjacent to the first outer bump,
the second test conductive pad is adjacent to the second outer bump, and
the controller is configured to control the first semiconductor chip; and
the first semiconductor chip further includes a first receiver electrically connected to the first outer bump and a second receiver electrically connected to the second outer bump.

20. The semiconductor package of claim 19,
wherein the controller is configured to supply one of the first and second test conductive pads with a first test signal, and the controller is configured to detect open failure by detecting whether or not the receivers receive the first test signal through the outer bumps; or wherein the controller is configured to supply one of the first and second test conductive pads with a second test signal, and the controller is configured to detect short failure based on whether or not the receivers receive the second test signal through the outer bumps.

* * * * *